(12) United States Patent
Chang

(10) Patent No.: US 6,461,981 B1
(45) Date of Patent: Oct. 8, 2002

(54) METHOD OF FORMING A CONFORMAL OXIDE FILM

(75) Inventor: Ching-Yu Chang, I-Lan Hsien (TW)

(73) Assignee: Macronix International Co., Ltd., Hsin-Chu (TW)

(*) Notice: Subject to any disclaimer, the term of this patent is extended or adjusted under 35 U.S.C. 154(b) by 0 days.

(21) Appl. No.: 09/682,340

(22) Filed: Aug. 22, 2001

(30) Foreign Application Priority Data

Feb. 2, 2001 (TW) .......................................... 090102184

(51) Int. Cl.[7] ........................ H01L 21/31; H01L 21/469
(52) U.S. Cl. ...................... 438/769; 438/253; 438/254; 438/396; 438/398; 438/445; 438/593
(58) Field of Search ................................ 438/769, 253, 438/254, 719, 264, 259, 265, 289, 255, 261, 702, 445, 244, 396, 444, 398, 243, 257, 238, 591, 593, 154

*Primary Examiner*—Matthew Smith
*Assistant Examiner*—Igwe U. Anya
(74) *Attorney, Agent, or Firm*—Winston Hsu

(57) ABSTRACT

A method that, using the surface-reaction mechanism of polysilicon in the chemical vapor deposition (CVD) process, starts in depositing a conformal first polysilicon layer on a uneven surface of a semiconductor wafer. The first polysilicon layer is then oxidized to a conformal first silicon oxide thin film. By repeating the previous two steps, a second polysilicon layer is formed on the surface of the first silicon oxide thin film and then oxidized to a second silicon oxide thin film with the required thickness. The conformal silicon oxide thin film formed by the method can be applied in structures of various devices in refined processes.

21 Claims, 6 Drawing Sheets

METHOD OF FORMING A CONFORMAL OXIDE FILM

BACKGROUND OF THE INVENTION

1. Field of the Invention

The present invention relates to a method of the forming a conformal oxide film, more specifically, to a method of forming a conformal silicon oxide film through repetitious deposition-oxidation processes. The method can be applied to form phosphosilicate glass (PSG) or borophosphosilicate glass (BPSG) as well by doping phosphorus (P) or boron (B) into the polysilicon layer prior to the oxidation process.

2. Description of the Prior Art

Silicon oxide, having a proper dielectric constant and excellent cohesion to silicon surfaces, is commonly used for gate oxide, local oxidation of silicon (LOCOS), field oxide, interlayer dielectric, pad oxide, etc. As the integration density of the electrical devices fabricated on the wafer increases, the standard for the quality and the step coverage ability of the silicon oxide becomes more rigid.

There are three commonly adopted methods for forming a silicon oxide film on the surface of a semiconductor wafer: (1) chemical vapor deposition (CVD), (2) thermal oxidation, and (3) spin-on glass (SOG). The CVD processes include silane low-pressure chemical vapor deposition ($SiH_4$-LPCVD), tetra-ethyl-ortho-silicate low-pressure chemical vapor deposition (TEOS-LPCVD), plasma-enhanced chemical vapor deposition (PECVD), etc. Generally a silicon oxide film formed by the CVD process has better step coverage ability and a film formed by thermal oxidation has better etch resistance. However, with the improvement of semiconductor processes, semiconductor device volumes are decreasing, so that the step coverage ability of silicon oxide formed by the CVD process needs to be improved significantly.

Please refer to FIG. 1. FIG. 1 is an enlarged cross-sectional view of a tiny structure 10 on the surface of a semiconductor wafer. For simplicity of description, other devices on the semiconductor wafer are omitted in FIG. 1. As shown in FIG. 1, the tiny structure 10, having a silicon oxide thin film 14 deposited by a TEOS-CVD process on the surface, is a protrudent structure with two approximately vertical walls 12. Though having excellent step coverage ability, the silicon oxide thin film 14 formed by the TEOS-CVD method is not deposited via a surface-reaction mechanism, so that portions of the silicon oxide thin film 14 in the corner area 16 can not be conformal, as is needed in many product applications.

SUMMARY OF THE INVENTION

It is therefore a primary objective of the present invention to provide a method of forming a conformal oxide film on a semiconductor wafer.

It is another objective of the present invention to provide a method of forming a conformal silicon oxide thin film with excellent step coverage ability and etch resistance.

It is another objective of the present invention to provide a method of forming a conformal silicon oxide thin film on uneven surfaces of tiny structures of the semiconductor through repetitious deposition-oxidation processes.

It is another objective of the present invention to provide a method of forming a conformal thin film, composed of phosphosilicate glass (PSG) or borophosphosilicate glass (BPSG), as well as to provide combinations of complex films composed of various silicate glasses.

It is another objective of the present invention to provide a method of forming an oxide film on an oxide-nitride-oxide (ONO) dielectric layer.

According to the claimed invention, a substrate of a semiconductor has at least one tridimensionally tiny structure. At the beginning of the method, a conformal first silicon film is deposited on the tridimensionally tiny structure. The first silicon film is then completely oxidized to form a conformal first oxide film on the tridimensionally tiny structure. By performing a deposition process, a conformal second silicon film is formed on the first oxide film. Finally, the second silicon film completely oxidized to form a conformal second oxide film on the tridimensionally tiny structure at the end of the claimed invention.

It is an advantage of the present invention that the present invention provides a method of forming a conformal silicon oxide film, with excellent step coverage ability, on uneven surfaces of tiny structures of the semiconductor through repetitious deposition-oxidation processes. Additionally, the present invention provides a method of forming a conformal thin film, composed of PSG or BPSG, or combinations of complex films composed of various silicate glasses.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
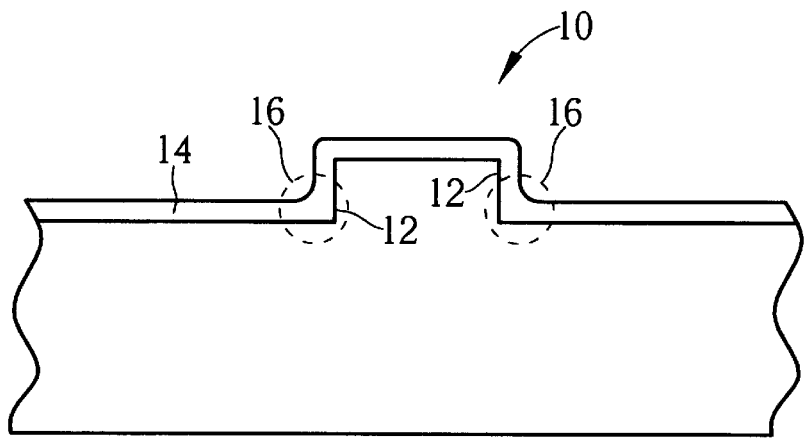
FIG. 1 is an enlarged cross-sectional view of a tiny structure on the surface of a semiconductor wafer according to the prior art.
Figure 2:
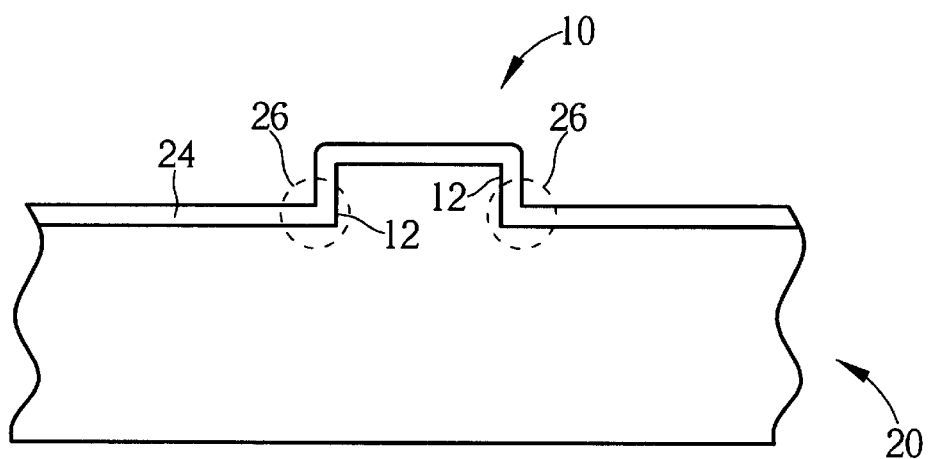
FIG. 2 is an enlarged cross-sectional view of a tiny structure on the surface of a semiconductor wafer according to the present invention.

Please refer to FIG. 2. FIG. 2 is an enlarged cross-sectional view of a tiny structure on the surface of a semiconductor wafer 20. For simplicity of description, other devices on the surface of the semiconductor wafer 20 have been omitted. As shown in FIG. 2, a protrudent tiny structure 10, composed of silicon nitride and having two approximately vertical walls 12 on either side, silicon oxide or other nonmetallic materials, is positioned on the surface of the semiconductor wafer 20. Because the composition and the function of the protrudent tiny structure 10 are not major contributors to the present invention, the method of the present invention can be applied on surfaces of the semiconductor wafer with similarly protrudent tiny structures. The main objective of the method provided in the present invention is to form a conformal silicon oxide thin film 24, with thickness ranging from tens to thousands of angstroms, on the surface of a corner area 26 within the protrudent tiny structure 10.

Figure 3:
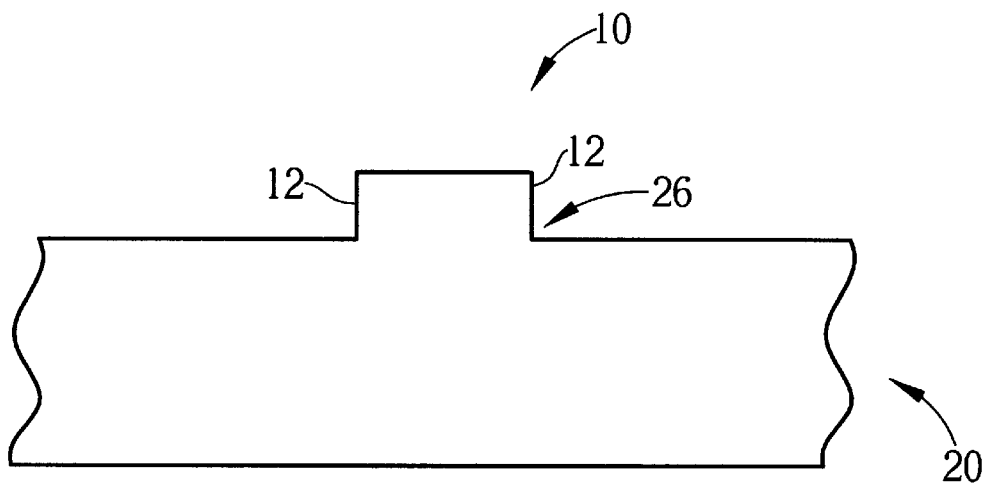
FIG. 3 to FIG. 7 are cross-sectional views of a preferred embodiment of the present invention.

Please refer to FIG. 3 to FIG. 7. These figures are cross-sectional views of a preferred embodiment of the present invention. As shown in FIG. 3, a semiconductor wafer 20 is provided with a protrudent tiny structure 10, with a corner area 26 and having two approximately vertical walls 12 on either side, on the surface of the wafer 20. The protrudent tiny structure 10 can be a gate, a capacitor or another similar device.

Figure 4:
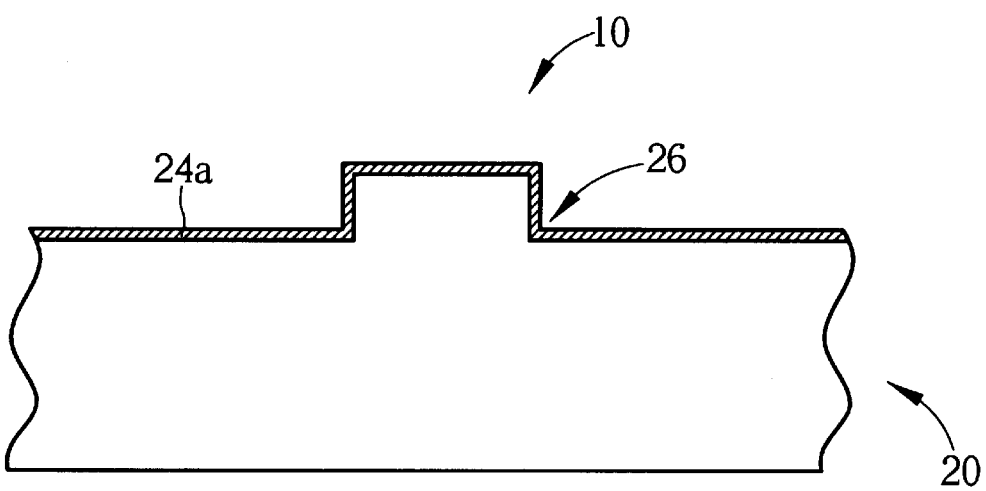

As shown in FIG. 4, the semiconductor wafer 20 is placed in a vacuum chamber or a furnace to undergo the chemical vapor deposition (CVD) process. A low-pressure chemical vapor deposition (LPCVD) process is then performed to form a conformal polysilicon layer 24a, with approximate thickness of 100 angstroms, on the surface of the protrudent tiny structure 10. The operating temperature and pressure for the LPCVD process as well as the surface temperature of the semiconductor wafer 20, using silane as the reacting gas with a flow rate from 100 to 120 standard cubic centimeters per minute (sccm), are 540° C. to 650° C. and 0.15 to 0.4 torr, respectively. The LPCVD process for poly-crystal silicon, having an operating temperature higher than 580° C., can be performed as well in the present invention to form a poly-crystal silicon layer (not shown) on the surface of the protrudent tiny structure 10. The conformal ability of poly-crystal silicon is better than that of amorphous. The suggested thickness of the polysilicon layer 24a is approximately 150 angstroms.

Figure 5:
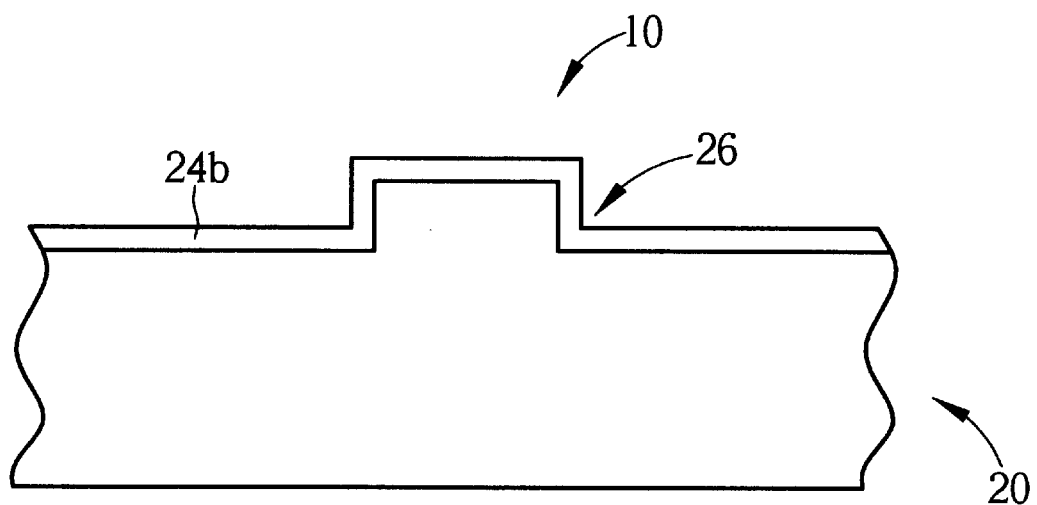

As shown in FIG. 5, an oxidation reaction is performed on the surface of the semiconductor wafer 20 to oxidize the polysilicon layer 24a to polysilicon oxide thin film 24b. In the preferred embodiment of the present invention, the oxidation reaction is a wet oxidation reaction, with an operating temperature from 550° C. to 750° C., as the reaction rate of wet oxidation is higher than that of dry oxidation. The polysilicon layer 24a in the present invention can also be oxidized at low temperatures by performing an oxygen plasma oxidation process or an ozone plasma oxidation process. In the preferred embodiment of the present invention, the thickness of the polysilicon oxide thin film 24b is approximately 250 angstroms, or about 1.6 times that of the polysilicon layer 24a.

Figure 6:
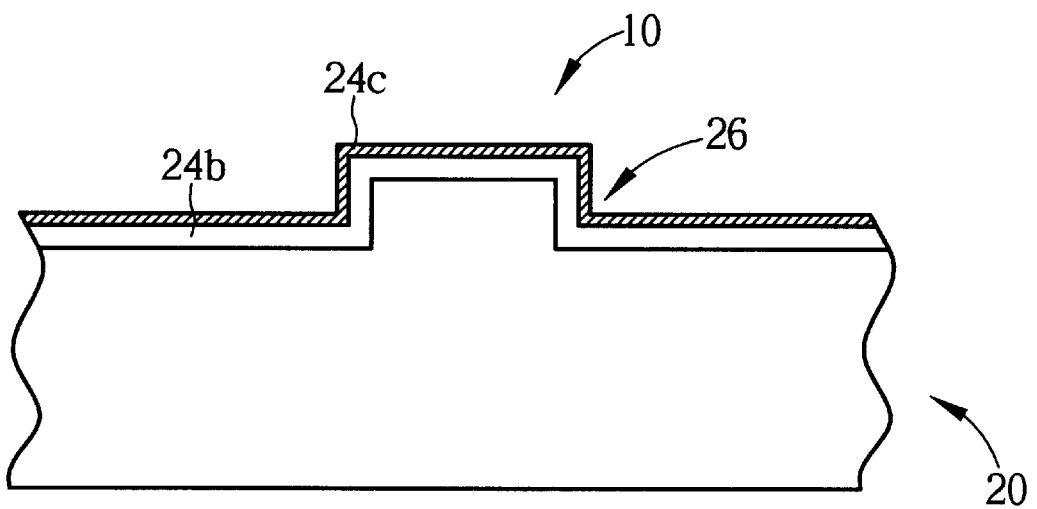
Figure 7:
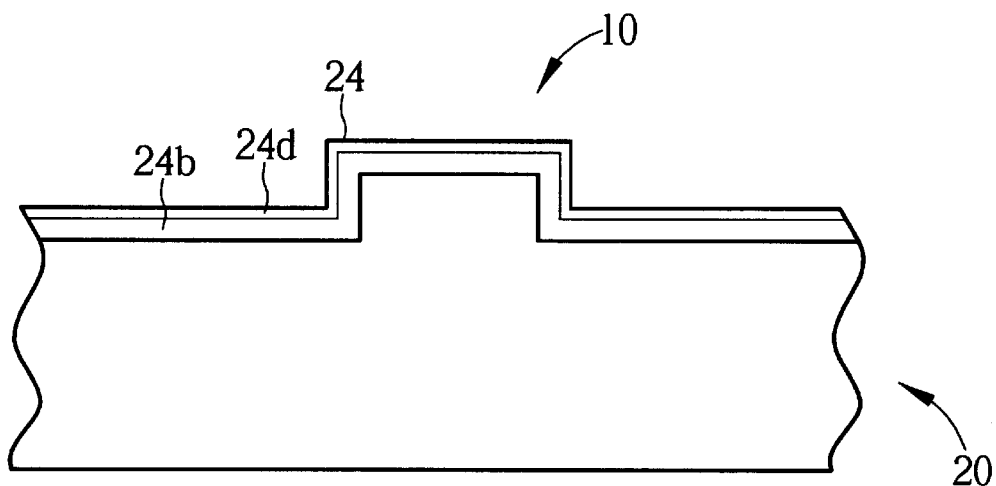

As shown in FIG. 6, the oxidation reaction in the previous paragraph is repeated, then an LPCVD process is performed to deposit a conformal polysilicon layer 24c of thickness approximately 100 angstroms on the surface of the polysilicon oxide thin film layer 24b. As shown in FIG. 7, a second oxidation reaction is performed to oxidize the polysilicon layer 24c completely into a polysilicon oxide thin film 24d. The oxidation reaction can be a wet oxidation reaction, dry oxidation reaction, oxygen plasma oxidation process, ozone plasma oxidation process, in-situ steam generation (ISSG) process or other similar oxidation process. A conformal polysilicon oxide thin film 24, composed of the polysilicon oxide thin film 24a and the polysilicon oxide thin film 24b, with a total thickness of 300 angstroms is thus formed after two polysilicon depositions and two polysilicon oxidation depositions. In an alternative embodiment of the present invention, the above steps can be repeated until the polysilicon oxide thin film with required thickness is formed.

Figure 8:
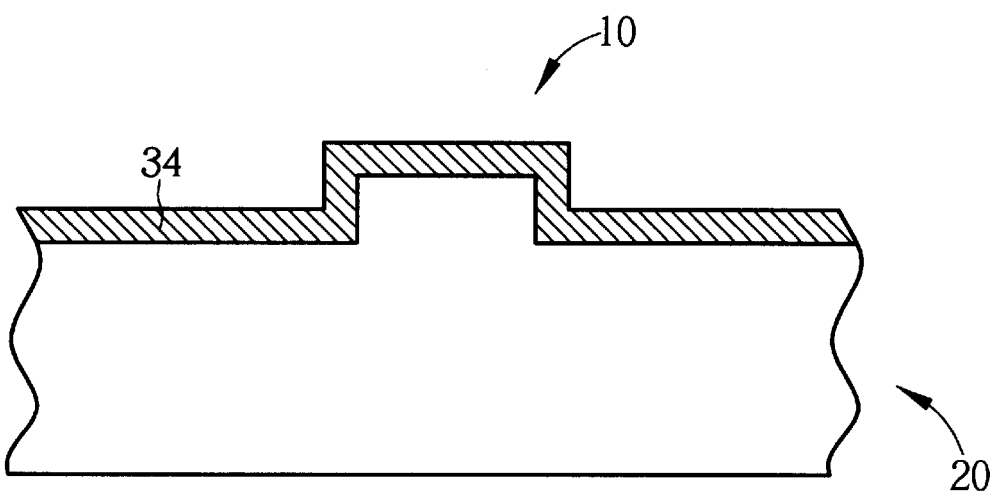
FIG. 8 is a cross-sectional view of a second embodiment of the present invention.

Please refer to FIG. 8. FIG. 8 is a cross-sectional view of a second embodiment of the present invention. As shown in FIG. 8, the method provided in the present invention can also form a conformal doped polysilicon oxide thin film 34. In-situ doping boron or phosphorus into the polysilicon layer, prior to the oxidation reaction that oxidizes the conformal doped polysilicon layer to a conformal PSG film or a BPSG film, allows for a phosphosilicate glass (PSG) film or borophosphosilicate glass (BPSG) film.

Figure 9:
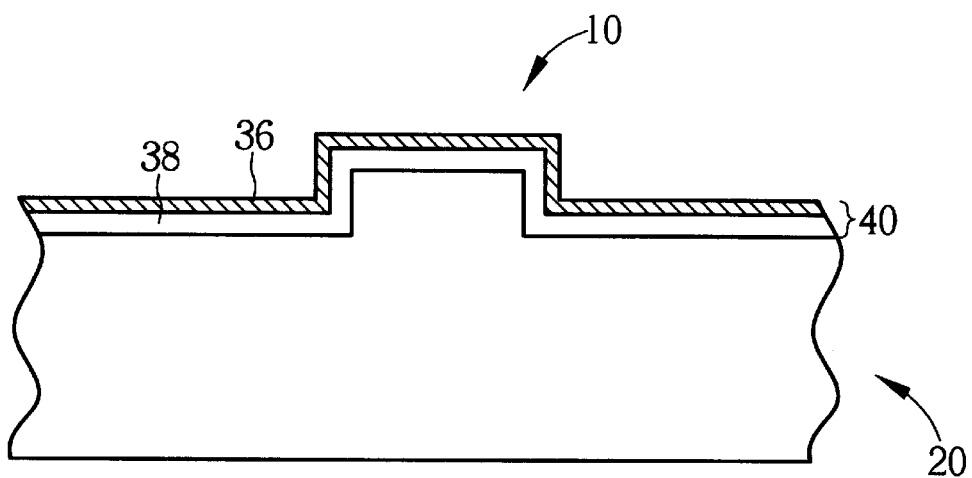
FIG. 9 is a cross-sectional view of a third embodiment of the present invention.

Please refer to FIG. 9. FIG. 9 is a cross-sectional view of a third embodiment of the present invention. As shown in FIG. 9, the method provided in the present invention can also be performed to form a complex silicate glass film 40 on the surface of the protrudent tiny structure 10. The complex silicate glass film 40 is composed of the conformal doped polysilicon oxide thin film 36 and a conformal polysilicon oxide thin film 38. The conformal doped polysilicon oxide thin film 36 can be formed by in-situ doping boron or phosphorus into the polysilicon layer prior to the oxidation reaction that oxidizes the conformal doped polysilicon layer to a conformal PSG film or a BPSG film.

Figure 10:
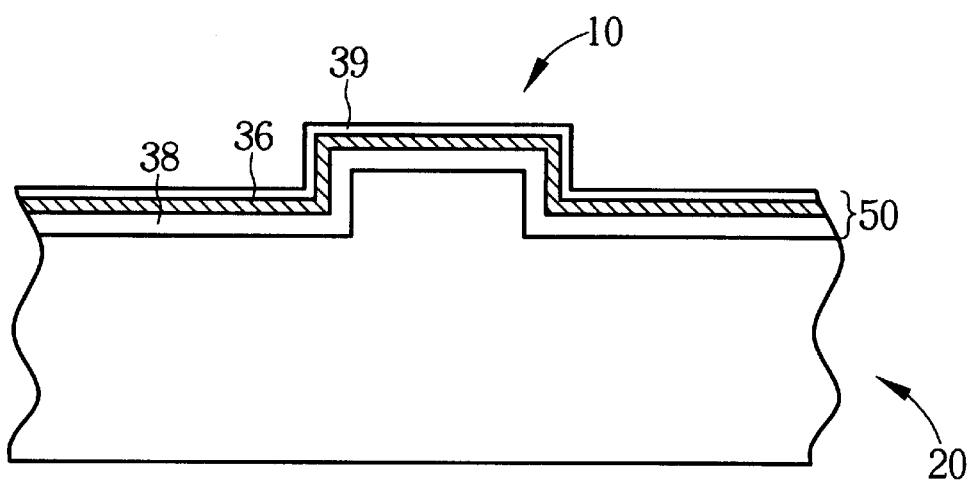
FIG. 10 is a cross-sectional view of a fourth embodiment of the present invention.

Please refer to FIG. 10. FIG. 10 is a cross-sectional view of a fourth embodiment of the present invention. As shown in FIG. 10, the method provided in the present invention can also be performed to form a conformal complex silicate glass thin film 50. The film 50 is composed of a conformal polysilicon oxide thin film 38, a doped polysilicon oxide thin film 36, and a conformal polysilicon oxide thin film 39 on the surface of a protrudent tiny structure 10. The conformal complex silicate glass thin film 50 can be formed by in-situ doping boron or phosphorus into the polysilicon layer prior to the oxidation reaction that oxidizes the conformal doped polysilicon layer to a conformal PSG film or a BPSG film.

Figure 11:
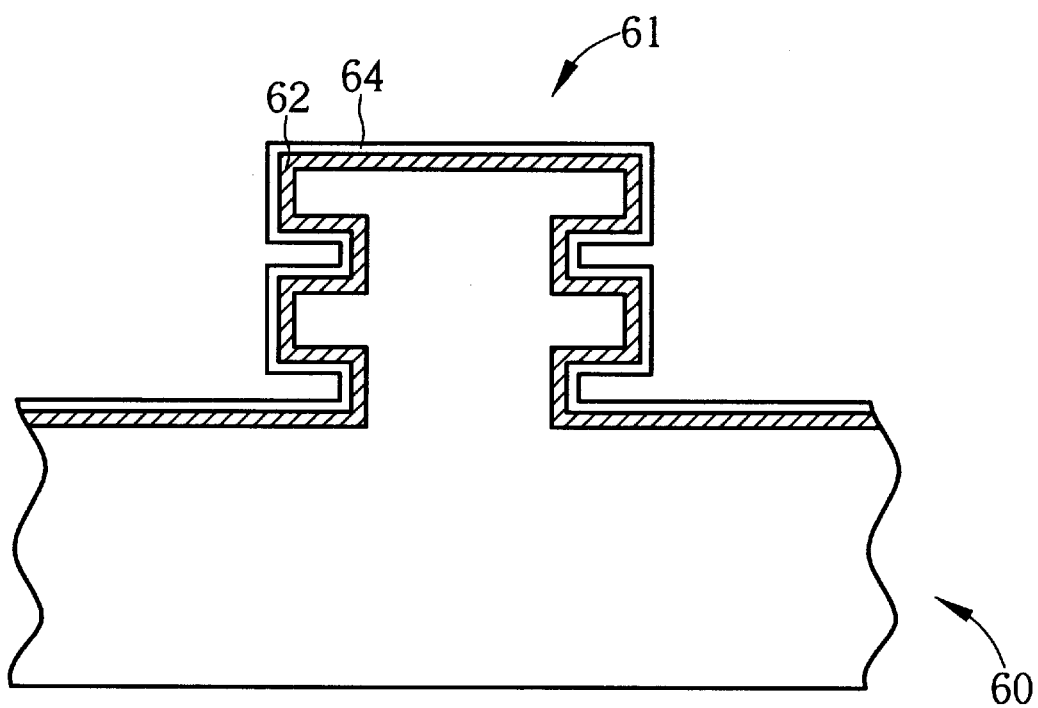
FIG. 11 is a cross-sectional view of a fifth embodiment of the present invention.

Please refer to FIG. 11. FIG. 11 is a cross-sectional view of a fifth embodiment of the present invention. As shown in FIG. 11, a bottom storage node 61, composed of doped polysilicon, of a fin-type capacitor is positioned on a semiconductor wafer 60. An oxide-nitride (ON) layer 62 and a polysilicon oxide thin film 64 are positioned on the surface of the bottom storage node 61 of the fin-type capacitor, respectively. The polysilicon oxide thin film 64 is formed by performing the deposition-oxidation processes or the repetitious deposition-oxidation processes provided in the present invention. An oxide-nitride-oxide (ONO) dielectric layer is formed by combining the polysilicon oxide thin film 64 and the ON layer 62. This is the insulating layer of the capacitor. According to the present invention, the ONO dielectric layer can be formed by forming the polysilicon oxide thin film 64, with the required thickness, after the surface of the ON layer 62 is completely cleaned.

In contrast with the prior art, the present invention 1) provides a method of forming a conformal silicon oxide film with excellent step coverage ability; 2) provides a method of forming a conformal silicon oxide thin film on uneven surfaces of tiny structures of the semiconductor through repetitious deposition-oxidation processes; and 3) provides a method of forming a conformal thin film, composed of PSG or BPSG, as well as providing combinations of complex films composed of various complex silicate glasses.

Those skilled in the art will readily observe that numerous modifications and alterations of the method may be made while retaining the teachings of the invention. Accordingly, the above disclosure should be construed as limited only by the metes and bound of the appended claims.

What is claimed is:

1. A method of forming a conformal oxide film comprising the following steps of:

provideng a substrate, having at least one tridimensionally tiny structure, of a semiconductor wafer;

depositing a conformal first silicon film on the tridimensionally tiny structure;

oxidizing the first silicon film completely to form a conformal first oxide film on the tridimensionally tiny structure;

depositing a conformal second silicon film on the first oxide film; and oxidizing the second silicon film completely to form a conformal second oxide film on the tridimensionally tiny structure.

2. The method of claim 1 wherein the tridimensionally tiny structure is a bottom storage node of a fin-type capacitor.

3. The method of claim 2 wherein an oxide-nitride (ON) layer is positioned on the surface of the bottom storage node of a fin-type capacitor.

4. The method of claim 1 wherein the first silicon film is composed of polysilicon.

5. The method of claim 1 wherein the second silicon film is composed of polysilicon.

6. The method of claim 1 wherein the first silicon film is composed of amorphous silicon.

7. The method of claim 1 wherein the second silicon film is composed of amorphous silicon.

8. The method of claim 1 wherein the oxidation of the first silicon film and the second silicon film is performed by using oxide plasma.

9. The method of claim 1 wherein the oxidation of the first silicon film and the second silicon film is performed by performing a wet-oxidation process.

10. The method of claim 1 wherein the oxidation of the first silicon film and the second silicon film is performed by performing a dry oxidation process.

11. The method of claim 1 wherein the deposition of both the first and second silicon films is done by performing a low-pressure chemical vapor deposition (LPCVD) process.

12. A method of forming a top oxide film on an oxide-nitride-oxide (ONO) dielectric layer comprising the following steps of:

oxidizing a silicon surface to form a bottom oxide film;

depositing a silicon nitride layer on the bottom oxide layer;

depositing a conformal first silicon film on the silicon nitride layer;

oxidizing the first silicon film completely to form a conformal first oxide film on the silicon nitride layer;

depositing a conformal second silicon film on the first oxide film; and oxidizing the second silicon film completely to from a conformal second oxide film on the silicon nitride film;

wherein the ONO dielectric layer is structurally formed by the bottom oxide film, the silicon nitride layer and the second oxide film.

13. The method of claim 12 wherein the ONO dielectric layer is formed on the surface of the bottom storage node of a fin-type capacitor.

14. The method of claim 12 wherein the first silicon film is composed of polysilicon.

15. The method of claim 12 wherein the second silicon film is composed of polysilicon.

16. The method of claim 12 wherein the first silicon film is composed of amorphous silicon.

17. The method of claim 12 wherein the second silicon film is composed of amorphous silicon.

18. The method of claim 12 wherein the oxidation of the first silicon film and the second silicon film is performed by using oxide plasma.

19. The method of claim 12 wherein the oxidation of the first silicon film and the second silicon film is performed by performing a wet-oxidation process.

20. The method of claim 12 wherein the oxidation of the first silicon film and the second silicon film is performed by performing a dry oxidation process.

21. The method of claim 12 wherein the deposition of both the first and second silicon films is done by performing a low-pressure chemical vapor deposition (LPCVD) process.

* * * * *